United States Patent [19]

Yamasita et al.

[11] Patent Number: 5,314,770

[45] Date of Patent: May 24, 1994

[54] METHOD FOR PRODUCING COLOR FILTER

[75] Inventors: Yukio Yamasita, Yokohama; Haruyoshi Sato, Kawasaki; Toru Nakamura, Yokohama; Hitoshi Yuasa, Yokohama; Yutaka Otsuki, Yokohama, all of Japan

[73] Assignee: Nippon Oil Co., Ltd., Tokyo, Japan

[21] Appl. No.: 872,615

[22] Filed: Apr. 22, 1992

[30] Foreign Application Priority Data

Apr. 26, 1991 [JP] Japan .................................. 3-097280
Apr. 26, 1991 [JP] Japan .................................. 3-097282

[51] Int. Cl.$^5$ ................................................ G03F 9/00
[52] U.S. Cl. ............................................ 430/7; 430/20; 430/142; 430/321; 430/324
[58] Field of Search ................. 430/7, 142, 324, 321, 430/20

[56] References Cited

U.S. PATENT DOCUMENTS

| | | | |
|---|---|---|---|
| 4,846,556 | 7/1989 | Haneda | 430/325 |
| 4,902,592 | 2/1990 | Matsumura et al. | 430/320 |
| 5,214,541 | 5/1993 | Yamasita et al. | 430/7 |

FOREIGN PATENT DOCUMENTS 63-210901 9/1988 Japan .

OTHER PUBLICATIONS

*Hackh's Chemical Dictionary*, 4th edition (1972), p. 473, Right Column, Definition of "Onium".

Flagello, et al. "A Single Expose Double Develop (SEDD) Process for Self-Aligned Lithographic Applications," 9 (1989), *Microelectronic Engnr* 8226, Nos. 1–4, pp. 47–52.

Primary Examiner—Charles L. Bowers, Jr.
Assistant Examiner—Geraldine Letscher
Attorney, Agent, or Firm—Darby & Darby

[57] ABSTRACT

A method for producing a color filter involves (A) forming a photosensitive coating film on an electrically conductive layer formed on a surface of a substrate, and exposing the photosensitive coating film trough a mask having patterns of at least three different degrees of light transmittances; (B) developing and removing a photosensitive coating film portion registering with one of the patterns of smallest and largest degrees of light transmittances for exposing the electrically conductive layer and electrodepositing a colord coating on the exposed electrically conductive layer for forming a colored layer thereon, operation of developing and removing the photosensitive coating film followed by electrodeposition being repeated for the respective patterns of different degrees of light transmittances in sequence of difference in transmittances for producing different colored layers, respectively; (C) selectively forming a metal layer in interstices present between the colored layers, and (D) transcribing the colored layers and the metal layer onto another substrate.

45 Claims, 2 Drawing Sheets

METHOD FOR PRODUCING COLOR FILTER

BACKGROUND OF THE INVENTION

This invention relates to a method for producing a color filter and more particularly to a color filter advantageously employed as a color liquid crystal display device.

Among the currently employed methods for preparing a color filter, there are a dyeing method consisting in dyeing a transparent substrate with a binder containing dyes and pigments, a printing method and a pigment dispersion method.

Since the dyeing method consists in selectively forming a thin resin film on a substrate with dyes, a resist printing process and a photolithographic process need to be performed each time the color is changed. Although resist printing is unnecessary with the printing method, there is a limit to the refinement of color patterns and, the larger is the number of colors, the printing position becomes the worse. Although the fine color pattern is possible with the pigment dispersion method, a high precision photolithographic process needs to be performed each time the color is changed, resulting in a complicated process.

For overcoming the deficiency, there is proposed in Japanese Laid-open Patent Application No. 59-114572 (1984) a method for producing a color filter by an electrodeposition coating method. With this method, a transparent electrode is prepared by patterning a transparent electrically conductive film deposited on the substrate, and electrical voltage is applied only to a portion of the patterned transparent electrode which is to be dyed in the same color. The substrate is immersed in a colored electrodeposition bath for forming a colored layer by electrodeposition. Electric voltage is then applied only to a portion of the substrate which is to be dyed in a different color, and the substrate is then immersed in a colored electrodeposition bath for forming a different color layer by electrodeposition. However, it is necessary with this method to perform a high precision patterning of the transparent electrode, and to pay meticulous care during the subsequent process not to break the fine pattern, because otherwise the subsequent coloring process is rendered difficult. Besides, the patterned transparent electrode needs to be electrically continuous, even in fine pattern sections, so that limitations are imposed on the degree of freedom of the pattern shape.

In Japanese Laid-open Patent Application No. 63-210901 (1988), there is proposed a method consisting in forming colored layers by light exposure, development and electrodeposition, using a mask having patterns only in areas to be dyed in the same colors and a positive type photosensitive resin composition, and repeating the steps of light exposure, development and electrodeposition a desired number of times. This method is inferior in stability because it makes use of a compound containing unstable quinone diazido groups. Besides, if the quinone diazido compound is brought into contact with an aqueous alkali solution, the quinone diazido compound in the unexposed part is also reacted with an aqueous alkali solution so that photosensitivity is markedly changed to present difficulties in the subsequent light exposure and development steps.

In these electrodeposition methods a transparent electrode for formation of colored layers is simultaneously used as an electrode for driving a liquid crystal. However, since the colored layers formed on the transparent electrode is made of an insulating material, the liquid crystal driving voltage becomes exceedingly high. For this reason, a transparent electrode for driving the liquid crystal is additionally provided on the colored layers formed in accordance with the above method for lowering the driving voltage. On the other hand, since the transparent electrode employed in the above method has a light transmittance of 80 to 85%, provision of two transparent electrode layers leads to lowered light transmittance to deteriorate the performance as a colored display substrate. For overcoming this defect, there is proposed in Japanese Laid-open Patent Application No. 1-22479 (1989) a method comprising forming a colored layer on a master plate and transferring it onto a transparent substrate. However, since the transfer is effected for each color with this prior-art method, it becomes necessary to achieve high precision alignment for each transfer operation, thus complicating the production.

On the other hand, in order to meet the demand for high performance of the device provided with a color filter, it has been desired to improve contrast and to prevent color purity from being lowered. In order to solve this problem, a method of forming a non-light transmitting film in a region of the color filter defined between neighboring pixels has been proposed. For forming the non-light transmitting film, there are known a method comprising forming pixels with alignment on a substrate on which a non-light transmitting film pattern is formed previously, and a method comprising forming a non-light transmitting film pattern with alignment on a substrate on which a pixel pattern is formed previously.

However, since it is necessary with these methods to effect an alignment operation between the pixel pattern and the non-light transmitting pattern, it is difficult with this precision to form a pattern of non-light transmitting pattern of a coincident size free of the light transmitting sections between the pixel patterns. If overlapped portions are produced, step differences are produced on a color filter, so that it becomes difficult to produce a color filter excellent in planarity.

With any of the above methods, high precision processing is required for alignment so that it is difficult to cope with the demand for a larger work size, that is a larger picture size with reduced costs.

SUMMARY OF THE INVENTION

It is an object of the present invention to provide a method for producing a color filter in which high precision fine machining technique is not required, the pattern figure of the colored layer has a high degree of freedom, non-light transmitting metal layers can be arrayed without gaps between the color filter pixels and the color filter size may be increased easily and in which mass production may be achieved easily and simply.

The above and other objects of the invention will become apparent from the following description.

The present invention provides a method for producing a color filter comprising the steps of:

(A) forming a photosensitive coating film on an electrically conductive layer formed on a surface of a substrate, and exposing the photosensitive coating film through a mask having patterns of at least three different degrees of light transmittances;

(B) developing and removing a photosensitive coating film portion registering with one of the patterns of smallest and largest degrees of light transmittances for exposing the electrically conductive layer and electrodepositing a colored coating on the exposed electrically conductive layer for forming a colored layer thereon, operation of developing and removing the photosensitive coating film followed by electrodeposition being repeated for the respective patterns of different degrees of light transmittances in sequence of difference in transmittances for producing different colored layers, respectively;

(C) selectively forming a metal layer in interstices present between the colored layers, and (D) transcribing the colored layers and the metal layer onto another substrate.

PREFERRED EMBODIMENTS OF THE INVENTION

Figure 1:
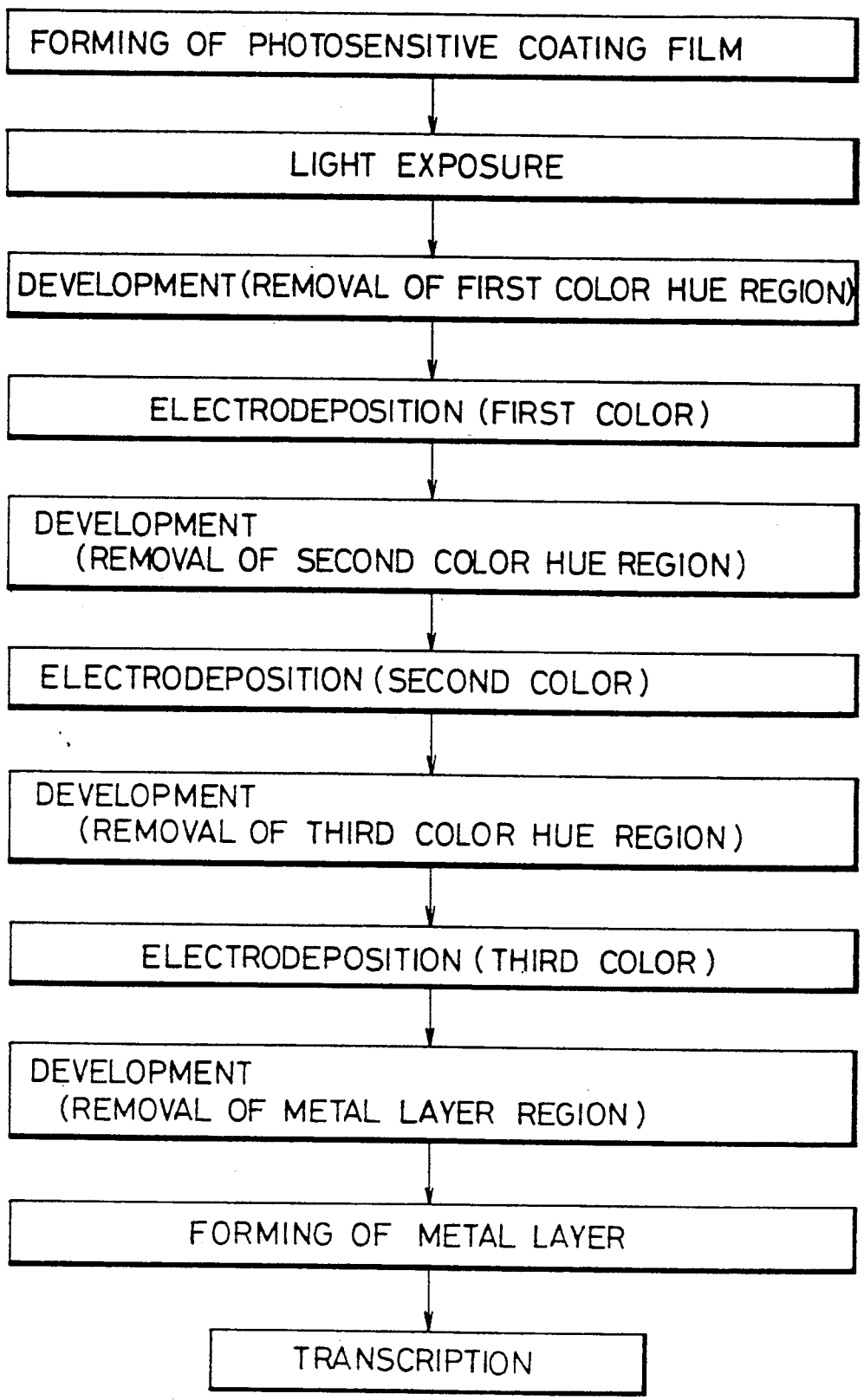
FIG. 1 shows a process according to an embodiment of the present invention.

The present invention will be explained in more detail hereinbelow.

According to the present invention, a photosensitive coating film is formed on a substrate having an electrically conductive layer on its surface, and light exposure is performed via a mask having patterns of at least three different degrees of light transmittances (the step is referred to hereinafter as step A).

There is no particular limitation to the substrate having an electrically conductive layer, if the substrate is a plate having an electrically conductive layer on its surface. Examples of the substrate may include a metallic plate or a plate of dielectric material having the electrically conductive layer on its surface. The substrate preferably has a smooth surface in view of the performance desired of a color filter. The surface of the substrate may be ground if so required. In order to perform transcription easily in the later step, a release layer such as a silicone film may be preliminarily formed on the surface of the substrate. The electrically conductive layer may be formed of any known materials. There is no particular limitation to the methods for forming an electrically conductive layer and any of the known methods such as spraying, chemical vapor deposition (CVD), sputtering, vacuum evaporation, electroplating, electroless-plating or metal cladding may be employed.

Although there is no particular limitation to the method of forming the photosensitive coating film on the electrically conductive layer formed on the substrate, a negative or positive type photosensitive coating may be applied on the substrate by the known methods, such as electrodeposition, spraying, dip coating, roll coating, screen printing or spin coating.

As the negative type photosensitive coating for forming the negative type photosensitive coating film, a negative type photosensitive coating resin exhibiting film forming capabilities and photosensitivity and a photopolymerization initiator may be dispersed or dissolved in a solvent such as an organic solvent or water so as to be used as a coating material. As the positive type photosensitive coating for forming the positive type photosensitive coating film, a positive type photosensitive coating resin exhibiting film coating capabilities and photosensitivity may be dispersed or dissolved in water or in an organic solvent so as to be used as a coating material. Dyes and/or pigments may be contained in the negative or positive type coatings.

The negative type photosensitive coating resin preferably employed in the present invention may include a prepolymer having photosensitive groups such as (meth)acryloyl groups, e.g. acryloyl or methacryloyl group, cinnamoyl groups or mixtures thereof at a terminal and/or side chain of the molecule, an onium group-containing cationic resin or a carboxylic group-containing anionic resin. The negative type photosensitive coating resin may have a molecular weight ranging between 500 and 10,000.

The prepolymer may preferably be formed from epoxy (meth)acrylate, urethane (meth)acrylate, polyester (meth)acrylate, or mixtures thereof.

The onium group-containing cationic resins may be composed of a main resin, such as acrylic resin, polyester resin, maleinated oil resin, polybutadiene resin, epoxy resin, urethane resin, polyamide resin or mixtures thereof, and the photosensitive groups and onium groups, such as amino group, ammonium group, sulfonium group or mixtures thereof, introduced therein. These resins may preferably be processed with an acidic susbstance such as formic acid, acetic acid, propionic acid, lactic acid or mixtures thereof, and solubilized and/or dispersed in water.

The carboxyl group-containing anionic resins may be composed of the above mentioned main resin into which carboxylic groups and the aforementioned photosensitive groups are introduced. These resins may preferably be solubilized and/or dispersed in basic substances, such as triethylamine, diethylamine, dimethylethanol amine, ammonia or mixtures thereof.

There is no particular limitation to the positive type photosensitive coating resin, if it is dissolved in a developing solution on light exposure, and may be enumerated by resins including quinone diazido groups, resins including diazomeldrum's acid or nitrobenzyl ester, or resin compositions including these resins. Specific examples of these resins include a quinone diazido group-containing cationic resin in which the onium groups and hydroxyl groups are introduced into the above main resins, to which a quinone diazido sulfonic acid compound is added further by esterification reaction followed by being processed with an acidic substance such as formic acid, acetic acid, propionic acid, lactic acid or mixtures thereof and solubilized and/or dispersed in water; a quinone diazido group-containing anionic resin in which carboxyl groups and hydroxyl groups are introduced into the above mentioned main resins, to which a quinone diazido sulfonic acid compound is further added by an esterificiation reaction followed by being processed with basic substances e.g. triethylamine, diethylamine, dimethylethanol amine, ammonia or mixtures thereof, and sulubilized and/or dispersed in water; a quinone diazido group-containing resin obtained by reacting a resin having film-forming capability and a hydroxyl group-compound with a quinone diazido compound including a quinone diazido sulfonic acid derivative or an isocyanate group; and resin compositions containing these resins. The mixing ratio for the resin compositions may be optionally selected depending on light exposure and development conditions.

As the negative type photosensitive coating resin and the positive type photosensitive coating resin, prepolymers or resins that may be solubilized and/or dispersed in water are most preferred for simplifying the process and combating the pollution.

The negative type photosensitive coating resins may also be admixed with low molecular (meth)acrylates for controlling photosensitive properties and viscosity of the coating film. Examples of such (meth)acrylates include 2-hydroxyethyl (meth)acrylate, 2-phenoxyethyl (meth)acrylate, 3-phenoxy-2-hydroxypropyl (meth)acrylate, 2-ethylhexyl (meth)acrylate, tricyclodecane (meth)acrylate, hexanediol-di(meth)acrylate, trimethylolpropane triacrylate, pentaerythritol triacrylate, dipentaerythritol hexacrylate, tris(acryloyl oxyethyl) isocyanurate, and mixtures thereof. The proportion of these (meth) acrylates is preferably up to 50 and most preferably up to 30 parts by weight to 100 parts by weight of the negative type photosensitive coating resin. If the proportion of the (meth)acrylates exceeds 50 parts by weight, the coating becomes undesirably tacky.

The photopolymerization initiator employed in the negative type photosensitive coating may be any of those known in the art and may be enumerated by benzoins, benzoin ethers, benzylalkyl ketals, benzophenone derivatives, anthraquinone derivatives, thioxanthone derivatives or mixtures thereof. Sensitizers may be added thereto if so desired. The photopolymerization initiator may be added in an amount of 0.1 to 30 and preferably 0.5 to 20 parts by weight to 100 parts by weight of the negative type photosensitive coating resin. If the amount of the initiator is less than 0.1 part by weight, photocuring properties fall short, whereas, if it exceeds 30 parts by weight, curing proceeds excessively and hence the coating film becomes poor in strength, while economic advantages are also lost.

The organic solvent used for dispersing or dissolving the components of the negative and positive type photosensitive coating resins may be any of those capable of dispersing or dissolving the above mentioned prepolymers or resins. Examples of the solvents include glycol ethers, such as ethyleneglycol monobutyl ether, ethyleneglycol monohexyl ether, ethyleneglycol monophenyl ether, propyleneglycol monomethyl ether, propyleneglycol monophenyl ether, diethyleneglycol dimethyl ether or triethyleneglycol dimethyl ether; ketones such as acetone, methylethyl ketone, methylisobutyl ketone, cyclohexanone or isophorone; ethers such as dibutyl ether, dioxane or tetrahydrofuran; alcohols such as methoxy butanol, diacetone alcohol, butanol or isopropanol; hydrocarbons such as toluene, xylene or hexane; esters such as ethyl acetate, butyl acetate, 2-methoxyethyl acetate, 2-methoxypropyl acetate or ethyl benzoate; acid amides such as dimethyl formamide, N,N-dimethyl acetoamide or dimethyl sulfoxide, and mixtures thereof.

These organic solvents may be added during solubilization or dispersion in water of the above mentioned cationic or anionic resins for improving bath stability or smoothing coating films.

The dyes and/or the pigments are preferably so selected as not to lower the stability and occasionally electrodeposition properties as well as durability of the coating. For this reason, oil soluble or dispersible dyes, such as azo, anthraquinone, benzodifuranone, condensed methine series dyes, or mixtures thereof, are preferred. The pigments may be exemplified by organic pigments, such as azo lake organic pigments, quinacridone organic pigments, phthalocyanine organic pigments, isoindolinone organic pigments, anthraquinone organic pigments or thioindigo organic pigments; chrome yellow, iron oxide, chrome vermilion, chrome green, ultramarine, prussian blue, cobalt blue, cobalt green, emerald green, titanium white, carbon black or mixtures thereof. As for the color hue of the dyes and pigments, reference is had to "COLOUR INDEX" whenever necessity arises.

The amount of the dyes and/or the pigments is suitably selected depending on the application, color hue, the type of the dyes and/or the pigments or the film thickness of the photosensitive coating. The amount may preferably be 3 to 70 wt. % and more preferably 5 to 60 wt. % based on the total photosensitive coating.

Depending on the type and the amounts of the dyes and/or pigments, the produced coating film may be rendered light transmitting or light intercepting according to the intended applications. For example, black tinted light-intercepting coating film may be produced by using 3 to 34 wt. % of carbon black, as pigments, based on the total amount of the negative or positive type photosensitive coating. The black-hued light-intercepting coating film is particularly desirable for preventing light leakage. The color hue of the dyes and/or the pigments may include white color hue. The dyes and/or the pigments are preferably purified for removing impurities. The photosensitive coating may be admixed with various assistant agents, such as dispersants for the dyes and/or the pigments, levelling agents for improving smoothness of the coating film, viscosity adjustment agents or defoaming agents.

For producing the negative type photosensitive coating, the negative type photosensitive coating resins, the photopolymerization initiator and the solvent are sufficiently dispersed, using a dispersion apparatus, such as customary sand mills, roll mills or attriters. The positive type photosensitive coating may be prepared by mixing and dispersing the resins for the positive type photosensitive coating and the solvent in the same manner as for the negative type coating. The dyes, pigments, acidic or basic substances, dispersants, levelling agents for improving smoothness of the coating film, viscosity adjustment agents or defoaming agents may be mixed and dispersed as needed. There is no limitation to the film thickness of the photosensitive coating films formed by the photosensitive coating and the film thickness may be suitably selected depending on the performance desired of the color filter. The dry film thickness may be usually 0.3 to 5 $\mu$m and preferably 1 to 3 $\mu$m. The film thickness may be adjusted by controlliing, for example electrodeposition conditions, such as voltage, electrodeposition time and bath temperature. However, film thickness adjustment may be usually made under the same conditions as those for electrodeposition coating of colored coatings, as will be explained subsequently.

According to the present invention, exposure of the photosensitive coating film is to be performed by using a mask having patterns of at least three different degrees of light transmittances. The light transmittance means an intensity ratio before and after transmission of the exposure light through the mask. At least three different light transmittance degrees of the mask patterns will suffice depending on the number of types of the colored coatings. The difference in the light transmittance degrees may be optionally determined depending on the conditions of light exposure and development. In general, the larger the relative difference in the respective light transmittances, the easier becomes the adjustment of light exposure time, which is more desirable. However, even if the difference in the light transmittances is small, the same objective may be achieved by enhancing the volume of light exposure or prolonging the light exposure time. Thus, a significant difference of 5% or more is desirable, although no limitations are placed on the relative difference in the light transmittances.

Light exposure may be usually achieved using a system radiating a large quantity of ultraviolet rays. For example, a high pressure mercury lamp, an ultra high pressure mercury lamp or a metal halide lamp may be used as a light source. If necessary, other radiation rays may also be employed. Light exposure conditions may be selected suitably depending on photosensitive coatings employed, light exposure devices and masks.

In the step A of the present invention, by effecting light exposure through a mask having patterns of at least three different degrees of light transmittances, a number of different exposure states which is the same as that of the different light transmittance degrees of the patterns may be provided in the photosensitive coating film.

In the method of the present invention, the step of forming a colored layer by applying a colored coating by electrodeposition on the transparent electrically conductive layer exposed after developing and removing the photosensitive coating film is repeated, next to the step A, in the order of the increasing light transmittance degrees of the patterns with use of the negative type photosensitive coating and in the order of the decreasing light transmittance degrees of the patterns with use of the positive type photosensitive coating, for producing the respective colored layers. That is, if the negative type photosensitive coating is employed, the portion of the photosensitive coating film corresponding to a pattern of the smallest degree of light transmittance of the patterns is selectively developed and removed, and the colored coating is electrodeposited on the exposed transparent electrically conductive layer to form a colored layer (step B). The portion of the coating film corresponding to the second smallest light transmittance degree of the patterns is then selectively developed and removed and the colored coating is electrodeposited on the exposed electrically conductive layer to form a colored layer. This sequence of operations is repeated to produce the colored layers, respectively (step B). If the positive type photosensitive coating is employed, the portion of the photosensitive coating film corresponding to a pattern of the largest light transmittance of the mask is selectively developed and removed and a colored coating is electrodeposited on the exposed transparent electrically conductive layer to form a colored layer (step B). The portion of the coating film corresponding to the second largest light transmittance degree of the patterns is then selectively developed and removed and a colored coating is electrodeposited on the exposed electrically conductive layer to form a colored layer. This sequence is repeated to produce the respective colored layers (step B).

The conditions for selectively developing and removing the photosensitive coating film may be changed depending on the volume of light exposure, solubility of the photosensitive coating in the developing solution, the types and the concentrations of the developing solution, development time and temperatures. Thus, the conditions may be suitably selected for the resin used for the preparation of the photosensitive coating. Specifically, aqueous solutions containing dissolved acidic materials may be used as a developing solution when the cationic resin is used as a component of the negative photosensitive coating. The acidic materials include organic acids, such as formic acid, acetic acid, propionic acid or lactic acid; inorganic acids, such as hydrochloric acid or phosphoric acid; and mixtures thereof. If lactic acid is used as a developing solution, it may be used at a concentration usually of 0.01 to 50 wt. % and preferably 0.01 to 30 wt. %. The developing temperature is usually 10° to 70° C. and preferably 20° to 50° C. and the developing time is usually 5 to 600 seconds. As a developing solution in case of employing an anionic resin as a component of the negative type photosensitive coating and as a developing solution for the positive type photosensitive coating, an aqueous solution containing basic substances dissolved therein, may be employed. The basic substances may include sodium carbonate, sodium hydrogen carbonate, sodium metasilicate, tetraalkyl ammonium hydroxide, sodium hydroxide, potassium hydroxide and mixtures thereof. If an aqueous solution of sodium carbonate is used as a developing solution, sodium carbonate may be used in a concentration range of 0.01 to 25 wt. % and preferably 0.05 to 15 wt. % for development. The development time usually is selected within a range of 5 to 600 and preferably 5 to 300 seconds generally at 10° to 70° C. A developing solution when the positive type photosensitive coating is employed may usually be an aqueous solution in which a basic material is dissolved. The basic material includes sodium carbonate, sodium hydrogen carbonate, sodium metasilicate, tetraalkyl ammonium hydroxide, sodium hydroxide, potassium hydroxide and mixtures thereof. For example, where an aqueous solution of sodium metasilicate is employed as a developing solution, development may be effected at the concentration of sodium metasilicate of 0.01 to 25 wt. % and preferably 0.05 to 20 wt. %. The developing temperature may usually be 10° to 70° C. and preferably be 15 to 50° C. and the developing time may be 2 to 600 seconds and preferably 4 to 300 seconds. For the developing solutions, organic solvents such as alcohols, glycol ethers, ketones, chlorinated hydrocarbons or mixtures thereof, may be employed. Surfactants or defoaming agents may also be added to these developing solutions for improving wettability or anti-foaming properties. Aqueous developing solutions are preferably employed in view of non-toxicity and sanitation in working environments.

After the development, colored coatings are electrodeposited on the exposed transparent electrically conductive layer for forming a colored layer.

In preparing the colored coating, cationic resins, anionic resins or photocurable resins are used as a film-forming component, and dyes and/or pigments are added as a colorant component. Acidic or basic substances may also be employed for dissolving and/or dispersing these components in water. Organic solvents may be added for facilitating dissolution and/or dispersion of the resins in the colored coating for improving bath stability or for producing smooth coating films.

The cationic resins may for example be resins composed of the main resins used in the photosensitive coating into which onium groups such as ammonium, sulfonium groups or amino groups are introduced, such as resins solubilized or dispersed in water with an acidic substance, such as formic acid, acetic acid, propionic acid, lactic acid or mixtures thereof.

The anionic resins may for example be resins composed of the main resins used in the photosensitive coating into which carboxyl groups, etc. are introduced, and may for example be resins solubilized or dispersed in water with basic substances such as triethylamine, diethylamine, dimethylethanol amine, ammonia or mixtures thereof.

As the photocurable resins, those prepolymers or resins containing acryloyl groups, methaeryloyl groups, cinnamoyl groups or mixtures thereof, that are used in the photosensitive coating film in the step A and that are suited for electrodeposition, may be employed. The above mentioned photopolymerization initiators may also be employed in combination.

The colored coatings employed in step B may be different in type, color hue, color concentration or color brightness in the regions exhibiting different light transmittances. Alternatively, the same colored coatings may be used in common for these regions.

The color hue of the colored coating may be selected suitably, depending on particular applications. For example, the photosensitive coating used in step A, the colored coating used in step B and the colored coatings used in step B in case of repeating the electrodepositing process several times, may be those exhibiting different color hues.

The dyes and/or pigments used in the colored coatings may be suitably selected depending on the targeted color hue. It is, however, preferred to use those dyes and/or pigments which are not unsatisfactory in transparency, stability, electrodeposition properties and durability of the coating film. Particularly preferred are those dyes or pigments which may be mixed as the occasion may demand in the above mentioned photosensitive coatings.

In the preparation of the colored coatings, resins, dyes and/or pigments, acidic or basic substances, organic solvents, dispersants for the dyes or pigments, levelling agents for improving smoothness of the coating films, viscosity controlling agents or anti-foaming agents are mixed together and dispersed sufficiently in a conventional dispersion device such as sand mill, roll mill or attriter. The resulting dispersion is diluted in water to a predetermined concentration of about 4 to 25 wt. % and preferably to 7 to 20 wt. % of solid content to produce a coating suitable for electrodeposition. The so-produced coating may be applied on the electrically conductive layer by electrodeposition for providing a colored layer.

There is no particular limitation to the film thickness of the colored layer, which may be suitably selected depending on the performance required of a color filter. However, the dry thickness is usually 0.3 to 5 $\mu$m and preferably 1 to 3 $\mu$m.

Although the conditions of electrodeposition may be suitably selected depending on the types of the colored coatings and film thickness of the colored coating films, the electrical voltage is usually 5 to 500 V dc and preferably 10 to 300 V dc, the electrodeposition time is usually 5 to 300 sec and preferably 10 to 200 sec and the liquid temperature is usually 10° to 35° C. and preferably 15° to 30° C. After lapse of the electrodeposition time sufficient to produce a desired film thickness, current conduction is discontinued and the substrate is taken out of the bath. The substrate is freed of excess bath liquid by washing with water and dried to produce the colored layer.

Although the drying conditions may be selected suitably depending on the conditions of the subsequent process steps, it is usually preferred that the conditions be such that surface moisture is dried, for example, the drying time be of the order of 0.5 minute to 1 hour and preferably 1 to 30 minutes at a temperature of 120° C. or lower and preferably 30° to 100° C. If the drying temperature is higher than 120° C., the photosensitive coating film is occasionally cured under heat to raise difficulties in the subsequent development process.

In the method of the present invention, a metal layer is selectively formed in the interstices between the colored layers formed in the step B (hereinafter referred to step C).

The metal layer may be formed by developing and removing the photosensitive coating film registering with at least one of the patterns of different degrees of light transmittances and/or registering with that portion other than the patterns remaining on the substrate followed by processing the exposed electrically conductive layer by electroplating or non-electroplating method. Such processing may be suitably selected using a variety of commonly used plating solutions and processing conditions selected from the ordinary processing conditions in conformity with the performance required of the color filter.

Among metals that may be used for a metal layer, there are metal materials that may be processed by plating, such as metals, e.g. copper, nickel, chromium, silver and gold, alloys of two or more of these metal materials, and metals obtained by mixing two or more of the metal materials in a plating bath. The thickness of the metal layer may be selected suitably depending on the performance required of the color filter, and may preferably be of the order of 10 nm to 5 $\mu$m and preferably 10 nm to 3 $\mu$m. The color filter may be made planar if the metal layer is of a thickness substantially equal to that of the colored layers.

With the method of the present invention, since in the aforementioned step C the metal layer may be formed by, for example plating on a region of the electrically conductive layer selectively exposed, so that the metal layer may be formed in a self-aligned manner between the regions or gaps between the colored layers. With such color filter, not only the contrast and color purity are improved, but also the function as an electrode sub-line may be fulfiled, so that signal delay in large screen display or heating within the cell may be diminished.

With the method of the present invention, the step D for transcription is performed, in which the colored layers obtained in step B and the metal layer obtained in the step C are transcribed onto another substrate or transcription substrate.

Although there is no limitation to the transcription substrate, it may be a transparent substrate, semi-transparent substrate or colored substrate, depending on the usage and application. Preferably, a transparent substrate, such as glass or plastics may be employed. Examples of the transparent substrates include glass, polyester, polysulfone, cellulose triacetate, polycarbonate, polyimide, polystyrene and polymethylpentene.

The transcription operation may be carried out under conditions in which the colored layers and the metal layer are transcribed simultaneously onto the transcription substrate.

The transcribing conditions may be suitably selected as a function of the types of the substrate materials, the material for the electrically conductive layer, the properties of the resin used for the colored layers, surface state or type of the material of the transcription substrate, and transcription temperature, pressure or time. In general, the temperature may be from room temperature to 150° C. and preferably room temperature to 120° C. The pressure may preferably be 0.05 to 10 kgf/cm$^2$ and more preferably 0.1 to 5 kgf/cm$^2$. The transcription time is 2 seconds to 1 hour and, above all, 5 seconds to 30 minutes.

The pressure during transcription is applied by means of a press, a laminator or a rubber-coated roll, occasionally under heating. If the colored layers are photosensitive, it may be photocured by light irradiation for transcription and, if necessary, heating and light irradiation may be effected simultaneously. For facilitating the transcription, the surface of the transcription substrate may be coated with a photocurable, pressure-sensitive or hot-melt type transparent adhesive. Heating and light irradiation may also be further effected after termination of the transcription step to achieve sufficient curing as well as to improve weather resistance and resistance to chemicals. Specifically, such re-heating may preferably be effected at 50° C. to 250° C. and more preferably at 100° to 200° C. for 5 minutes to one hour and, above all, for 10 to 30 minutes, depending on the type of the resins employed. The substrate may be re-used after transcription.

The objective color filter may be prepared by the above steps A, B, C and D. If necessary, heating, curing, photocuring may be carried out further for further improving weather resistance and resistance to chemicals. The heating and curing conditions may include the temperature of 100° to 250° C. and preferably 150° to 250° C. and the curing time of 5 minutes to one hour and preferably 15 to 40 minutes.

The process of the present invention will be explained by referring to FIGS. 1 to 3, only by way of illustration.

Figure 2:
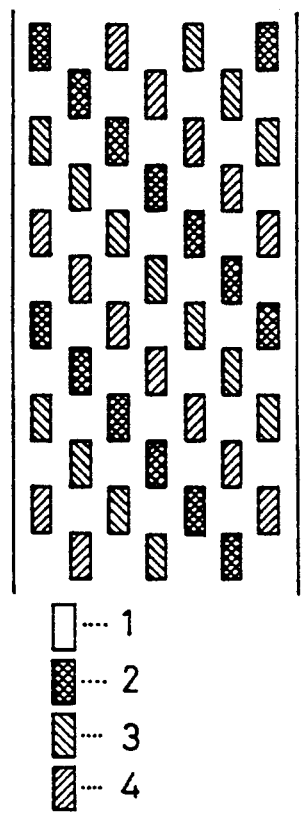
FIG. 2 is an enlarged schematic view showing a mask employed in Examples 1, 2 and 3 of the present invention.

Referring to FIGS. 1 and 2, the process of the present invention, wherein a negative type photosensitive resin is used as a photosensitive resin, is explained.

FIG. 1 shows a process according to an embodiment of the present invention. FIG. 2 is an enlarged schematic view showing a mask according to an embodiment of the present invention wherein light transmittance is changed in four degrees. In FIG. 2, 1 is a mask region with a 100% light transmittance corresponding to a light-intercepting film region, 2 is a mask region with a 5% light transmittance corresponding to a first color region, 3 is a mask region with a 25% light transmittance corresponding to a second color region and 4 is a mask region with an 80% light transmittance corresponding to a third color region.

A photosensitive coating film is formed on an electrically conductive layer formed on the surface of a substrate. The substrate is then dried and exposed to light through a mask shown for example in FIG. 2. The substrate is subjected to a first developing operation for exposing to outside a first color region of the electrically conductive layer in register with the 5% light transmittance mask region 2. The substrate is then processed in an electrodeposition bath containing a colored coating of a first color for electrodeposition coating followed by washing with water.

The substrate is then subjected to second development under conditions different from those for the first development for exposing to outside a second color region of the electrically conductive layer in register with the 25% light transmittance mask region 3. The substrate is then processed with electrodeposition coating in an electrodeposition bath containing a colored coating of a second color followed by washing with water.

The substrate is then subjected to third development under conditions different from those used in the first and second developing operations for exposing to outside a third color region of the electrically conductive layer in register with the mask region 4 with 80% light transmittance. The substrate is processed with electrodeposition coating in an electrodeposition bath containing a colored coating of a third color followed by washing with water and drying for forming a colored layer having a light-intercepting film region.

The substrate is then subjected to fourth development operation under conditions different from those used in the first to third developing operations for exposing to outside a light-intercepting film region of the electrically conductive layer in register with the maximum light transmittance mask region. A metallic layer is then formed by, for example, plating.

The colored layers and the metal layer thus formed on the substrate, is transcribed onto another substrate or transcription substrate for producing a color filter of the present invention.

Figure 3:
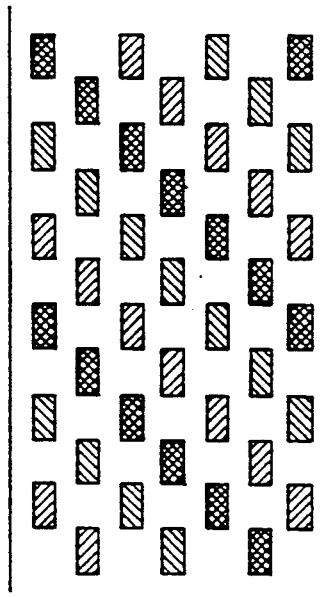
FIG. 3 is an enlarged schematic view showing a mask employed in Examples 4, 5 and 6 of the present invention.

Referring to FIGS. 1 and 3, the process of the present invention will be explained, in a case wherein a positive type photosensitive resin is employed as a photosensitive resin. However, the present invention is not limited to this merely illustrative process.

FIG. 1 shows the process steps according to another embodiment of the present invention. FIG. 3 is an enlarged schematic view of a mask according to another embodiment of the present invention wherein light transmittance is changed in four degrees, wherein 5 is a 1% light transmittance mask region in register with a light-intercepting film region, 6 is a mask region with a 100% light transmittance in register with a first color region, 7 is a mask region with a 50% light transmittance in register with a second color region and 8 is a mask region with a 25% light transmittance in register with a third color region.

A positive type photosensitive coating film is first formed on an electrically conductive layer formed on a substrate. The substrate is dried and exposed to light through a mask shown for example in FIG. 3. The substrate is then subjected to a first developing operation for exposing to outside a first color region of the electrically conductive layer in register with the mask region 6 with the maximum light transmittance. The substrate is then immersed in an electrodeposition bath containing a colored coating of a first color for electrodeposition coating followed by washing with water.

A second developing operation is then carried out under conditions different from those used in the first developing operation for exposing to outside a second color region of the electrically conductive layer in register with the second highest light transmittance mask region 7. The substrate is then processed in an electrodeposition bath containing a colored coating of a second color for electrodeposition coating followed by washing with water.

A third developing operation is then carried out under conditions different from those used in the first or second developing operations for exposing to outside a third color region of the electrically conductive layer in register with the third highest light transmittance mask region 8. The substrate is then processed in an electrodeposition bath containing a colored coating of a third color for electrodeposition coating followed by washing with water and drying for forming a colored layer.

A fourth developing operation is then carried out under conditions different from those used in the first to third developing operations for exposing to outside a light-intercepting film region of the electrically conductive layer in register with the minimum light transmittance mask region. A metal layer is then formed by plating, etc.

The colored layers thus formed on the substrate is transcribed to another substrate or transcription substrate for producing a color filter of the present invention.

According to the present invention, preferred is a method consisting in using, as a photosensitive coating, a coating obtained by dissolving and/or dispersing a cationic resin in water, applying the coating by an electrodeposition method, and forming a colored layer by a colored coating prepared by using an anionic resin, or a method consisting in applying a photosensitive coating obtained by dissolving and/or dispersing an anionic resin in water and forming a colored layer using a colored coating prepared by using a cationic resin.

The method for producing the color filter of the present invention is not in need of fine processing technique, while it is possible to raise the degree of freedom in selecting the patterned shape of the colored layers. Besides, any desired patterning may be achieved by one time light exposure operation and non-light transmitting films may be formed easily, while it is possible to cope with increasing the size of the color filter. Also, since there is no necessity for providing an electrode between the colored layers and the substrate, a color filter in which light transmittance is not lowered and the driving voltage may be lowered may be mass-produced easily.

EXAMPLES OF THE INVENTION

The present invention will be hereinafter explained in detail with reference to Synthesis Examples and Examples which are given only for the sake of illustration. In the following Examples, parts stand for those by weight.

SYNTHESIS EXAMPLE 1

Synthesis of Photosensitive Resin (A-1)

Synthesis of Amine-added Expoxidated Polybutadiene (a-1)

1,000 g of epoxidated liquid polybutadiene, manufactured by NIPPON PETROCHEMICALS CO., LTD. under the trade name of "E-1000-8", with a number average molecular weight of 1,000 and an oxirane oxygen content of 8%, were charged into a 2 lit separable flask, fitted with a thermometer, stirrer and a reflux cooling pipe. After replacing the atmosphere within the system by nitrogen, 231.2 g of methylethanol amine were added and reaction was carried out at 170° C. for five hours. Non-reacted methylethanol amine was then distilled off under reduced pressure to produce amine-added epoxidated polybutadiene (a-1) with an amine value of 230.4 mmol/100 g.

Synthesis of Unsaturated Group-Containing Isocyanate Compound 435.5 g of 2,4-tolylene diisocyanate and 266.1 g of diethylene glycol dimethyl ether were charged into a 2 lit round-bottom flask, which may be heated and cooled and which was fitted with a thermometer, a stirrer, a reflux cooling pipe and a dropping funnel. After heating to 40° C., 362.8 g of 2-hydroxyethyl acrylate were added dropwise from the dropping funnel. 200 ppm of p-benzoquinone was also added at this time. Since some heat was evolved due to dropwise addition of 2-hydroxyethyl acrylate, the system was occasionally cooled for maintaining the constant temperature. After the end of the dropwise addition of 2-hydroxyethyl acrylate, the temperature was raised to 70° C., at which temperature the reaction was carried out for three hours. After the IR absorption spectral analyses revealed that the absorption intensity of the isocyanate groups was decreased to about one half that before start of the reaction, the reaction system was cooled to produce an unsaturated group-containing isocyanate compound (a-2).

Synthesis of Photosensitive Resin (A-1)

500 g of (a-1) were dissolved in 166.7 g of diethylene glycol dimethyl ether in a 2 lit separable flask. 713.4 g of (a-2), in which isocyanate groups are contained in an amount of 0.8 equivalent to 1 equivalent of hydroxyl groups, were added dropwise at 40° C., at which temperature the reaction was carried out for one hour. The IR absorption spectral analyses indicated that the isocyanate groups had disappeared. A photosensitive resin (A-1), in which (a-2) was added to (a-1), was produced.

SYNTHESIS EXAMPLE 2

Synthesis of Polyamine (A-2) Solution 1,000 g of "NISSEKI POLYBUTADIENE B-1000", trade name of a product manufactured by NIPPON PETROCHEMICALS CO., LTD., with a number average molecular weight of 1,000, an iodine value of 430, and 1,2-linkage of 65 percent, 554 g of maleic anhydride, 10 g of xylene and 3.0 g of trimethyl hydroquinone, were charged into 3 lit separable flask, fitted with a thermometer, a stirrer, a reflux cooling pipe and a nitrogen blowing tube, and reaction was carried out under nitrogen at 190° C. for five hours. After non-reacted maleic anhydride and xylene were distilled off, maleinated polybutadiene with a total acid value of 400 mg KOH/G, was produced.

Then, 1,000 g of the maleinated polybutadiene and 433 g of ethylene glycol monobutyl ether were charged and uniformly dissolved in a 3 lit separable flask fitted with a reflux cooling pipe. 364.3 g of N,N-dimethyl amino propylamine were added dropwise over one hour, while the temperature of 135° C. was maintained under a nitrogen stream. After the same temperature was maintained for five hours, a polyamine solution containing tertiary amino groups and imido groups (A-2 solution) was produced. The produced polyamine (A-2 solution.) contained 206 mmols of tertiary amines per 100 g of solution, with the non-volatile content amounting to 75.0 wt. %.

SYNTHESIS EXAMPLE 3

Synthesis of Half-Esterified Product (A-3) solution

"1,000 g of "NISSEKI POLYBUTADIENE B-1000", trade name of a product manufactured by NIPPON PETROCHEMICALS CO., LTD., with a number average molecular weight of 1,000, an iodine value of 430, and 1,2-linkage of 65 percent, 554 g of maleic anhydride, 10 g of xylene and 3.0 g of trimethyl hydroquinone were charged into 3 lit separable flask, fitted with a thermometer, a stirrer, a reflux cooling pipe and a nitrogen blowing tube, and reaction was carried out under nitrogen at 190° C. for five hours. After non-reacted maleic anhydride and xylene were distilled off, maleinated polybutadiene with a total acid value of 400 mg KOH/G was produced.

Then, 1,000 g of the maleinated polybutadiene and 461.8 g of diethylene glycol dimethyl ether, 3.0 g of N,N-dimethyl benzyl amine and 385.5 g of benzyl alcohol were charged into a 3 lit flask fitted with a reflux cooling tube. After the mixture was dissolved uniformly, reaction was carried out under nitrogen at 120° C. for two hours to produce a half-esterified product (A-3) in solution. The total acid value of the produced half-esterified product (A-3) in solution was 109.3 mg KOH/G and the non-voltile content amounted to 75.0 wt. %.

SYNTHESIS EXAMPLE 4

Synthesis of Resin (A-4)

400 g of the maleinated polybutadiene obtained in Synthesis Example 3, 188.5 g of diethylene glycol dimethyl ether and 0.4 g of hydroquinone were charged into a 2 lit separable flask fitted with a reflux cooling tube. After the temperature was raised to 80° C., the mixture was agitated and homogenized. Then, 165.6 g of 2-hydroxyethyl acrylate and 20 g of triethylamine were added and reaction was carried out at the above temperature for two hours to produce a solution of a half-esterified product of the maleinated polybutadiene (A-4). The total acid value of the produced half-esterified product (A-4) solution was 105 mg KOH/G and the non-volatile content amounted to 75.0 wt. %.

SYNTHESIS EXAMPLE 5

Preparation of Photosensitive Coating (B-1)

To 500 g of the photosensitive coating (A-1) obtained in Synthesis Example 1, 27.0 g of "IRGACURE 907" and 3.0 g of "KAYACURE DETX", trade names of a photopolymerization initiator manufactured and sold by CIBA GEIGY INC. and NIPPON KAYAKU CO., LTD., respectively, were added under agitation and mixed together. To the resulting mixture, 16.7 g of acetic acid as a neutralizer was added and agitated thoroughly. After re-homogenization, de-ionized water was added gradually to the homogenized mass and agitated vigorously by a high-speed mixer to effect dispersion in water to produce a cationic electrodeposition type aqueous solution of a photosensitive coating (B-1) having a solid concentration of 15 wt %.

SYNTHESIS EXAMPLE 6

Preparation of Photosensitive Coating (B-2)

To 500 g of the photosensitive resin (A-1), produced in Synthesis Example 1, 27.0 g of "IRGACURE 907" and 3.0 g of "KAYACURE DETX", trade names of the photopolymerization initiators manufactured and sold by CIBA GEIGY INC. and NIPPON KAYAKU CO., LTD., respectively, were added under agitation and mixed together. The resulting mixture was diluted with methylethyl ketone to have a solid concentration of 40 wt % to prepare a photosensitive coating solution (B-2).

SYNTHESIS EXAMPLE 7

Preparation of Photosensitive Coating (B-3)

To 500 g of a half-ester (A-4) solution, obtained in Synthesis Example 4, 27.0 g of "IRGACURE 907" and 3.0 g of "KAYACURE DETX", trade names of the photopolymerization initiators manufactured and sold by CIBA GEIGY INC. and NIPPON KAYAKU CO., LTD., respectively, were added under agitation and mixed together. To the resulting mixture were added 33.7 g of triethylamine as a neutralizer and the resulting mixture was agitated thoroughly. After re-homogenization, de-ionized water was added gradually and the resulting mass was agitated vigorously by a high-speed mixer to effect dispersion in water to prepare an anionic electrodeposition type aqueous solution of the photosensitive coating (B-3) having a solid concentration of 15 wt %.

SYNTHESIS EXAMPLE 8

Preparation of Colored coatings (C-1, C-2 and C-3)

The half-ester solution (A-3) and pigments were mixed under agitation and dispersed by a three-roll roll mill for laboratory use manufactured by KODAIRA SEISAKUSHO KK to have a particle size of not more than 0.3 μm. The particle size was measured using a COULTER counter N4 manufactured by a COULTER INC. To each of the resulting mixtures in dispersion was added triethylamine as a neutralizer and each of the resulting masses was re-homogenized. As de-ionized water was added gradually, each homogenized mass was agitated vigorously so that the resulting mass was dispersed in water to produce colored coatings (C-1), (C-2) and (C-3) having a solid concentration of 10 wt %. Table 1 shows the anionic electrodeposition type compositions of the produced aqueous solutions of three colored coatings. In Table 1, the figures denote parts by weight.

TABLE 1

| Coating Color | C-1 Red | C-2 Yellow | C-3 Blue |
| --- | --- | --- | --- |
| Half-ester (A-3) solution | 213.3 | 213.3 | 213.3 |
| Triethylamine (neutralizer) | 21.0 | 21.0 | 21.0 |
| Ion-exchanged water | 1725.7 | 1725.7 | 1725.7 |
| Phthalocyanine blue (note 1) | — | — | 20 |
| Phthalocyanine green (note 2) | — | 20 | — |
| Azo metal salt red pigment (note 3) | 20 | — | — |

(note 1) "SR-150C" manufactured by SANYO SHIKISO KK
(note 2) "SAX" manufactured by SANYO SHIKISO KK
(note 3) "PIGMENT RED 4BS" manufactured by SANYO SHIKISO KK

SYNTHESIS EXAMPLE 9

Preparation of Colored Coatings (C-4, C-5 and C-6)

The polyamine (A-2) solution and pigments were mixed under agitation and dispersed by a laboratory type three-roll roll mill, manufactured by KODAIRA SEISAKUSHO KK to have a particle size of not more than 0.3 μm. The particle size was measured using a COULTER counter N4 manufactured by COULTER INC. To each of the resulting mixtures in dispersion was added acetic acid as a neutralizer and each of the resulting masses was agitated thoroughly. After re-homogenization, de-ionized water was added gradually to each re-homogenized mass. Each of the resulting mixtures was agitated vigorously by a high-speed mixer to effect dispersion in water to prepare colored coatings (C-4), (C-5) and (C-6) having solid concentrations of 10 wt %. Table 2 shows the compositions of the aqueous solutions of the produced three colored coatings of the cationic electrodeposition type. In Table 2, the figures denote parts by weight.

TABLE 2

| Coating Color | C-4 Red | C-5 Green | C-6 Blue |
|---|---|---|---|
| Polyamine (A-2) solution | 213.3 | 213.3 | 213.3 |
| Acetic acid (neutralizer) | 19.8 | 19.8 | 19.8 |
| Ion-exchanged water | 1726.9 | 1726.9 | 1726.9 |
| Phthalocyanine blue (note 1) | — | — | 20 |
| Phthalocyanine green (note 2) | — | 20 | — |
| Azo metal salt red pigment (note 3) | 20 | — | — |

(note 1) "SR-150C" manufactured by SANYO SHIKISO KK
(note 2) "SAX" manufactured by SANYO SHIKISO KK
(note 3) "PIGMENT RED 4BS" manufactured by SANYO SHIKISO KK

SYNTHESIS EXAMPLE 10

Synthesis of UV Curable Type Pressure Sensitive Adhesive

A mixture of 80 parts by weight of 2-ethylhexyl acrylate, 5 parts by weight of tetrahydrofurfuryl acrylate, 15 parts by weight of acrylic acid, 4 parts by weight of α,α'-azobisisobutyronitrile and 200 parts by weight of toluene, was reacted at 80° C. for 8 hours under agitation in a nitrogen stream to obtain a copolymer solution. The solution was heated to 100° C., and a mixed liquid composed of 5 parts by weight of glycidyl methacrylate, 0.5 part by weight of triethyl benzyl ammonium chloride and 0.1 part by weight of methoquinone was added dropwise to the solution over 30 minutes. The resulting mass was reacted at the same temperature for 20 hours to obtain a prepolymer. 5 parts by weight of "IRGACURE 907", a trade name of a photopolymerization initiator manufactured and sold by CIBA GEIGY INC. were added to the produced prepolymer to give a UV curable pressure sensitive adhesive.

SYNTHETIC EXAMPLE 11

Synthesis of Cationic Positive Type Photosensitive Resin (A-5)

Synthesis of Unsaturated Compound (a-3)

148 parts of glycidol, 0.8 part of dibutyl tin dilaurylate, 0.2 part of hydroquinone monomethyl ether and 82 parts of 2-ethoxyethyl acetate were charged into a 1 lit separable flask fitted with a thermometer, an agitator, a reflux cooling tube, a gas inlet pipe and a dropping funnel, and the temperature was raised to 50° C. 319 parts of methacryloyloxyethyl isocyanate were added dropwise over an hour as air was blown into the system and reaction was carried out until absorption of the isocyanate groups in IR absorption spectrum substantially disappeared. 276 parts of 4-hydroxy benzoic acid were added, and the temperature was raised to 110° C. After it was confirmed that the acid value was not more than 5 and the epoxide equivalent weight was not less than 11,000, the reaction was discontinued to produce an unsaturated compound (a-3).

Synthesis of Cationic Positive Type Photosensitive Resin (A-5)

238 parts of diethylene glycol monoethyl ether were charged into a 1 lit separable flask fitted with a thermometer, an agitator, a reflux cooling tube and a dropping funnel, and the temperature was raised to 130° C. Into this mixture, a mixed solution composed of 145 parts of (a-3), 83 parts of isobutyl methacrylate, 167 parts of ethyl acrylate, 78 parts of ethyl methacrylate, 41 parts of dimethylaminoethyl methacrylate and 12 parts of t-butyl peroxy-2-ethyl hexanoate were added dropwise over three hours. After lapse of 30 minutes, a mixed solution of 25 parts of diethylene glycol monoethyl ether and 2 parts of t-butyl peroxy-2-ethyl hexanoate was added dropwise over 30 minutes. The resulting mass was maintained at this temperature for two hours to terminate the reaction. 500 parts of the produced acrylic resin solution were taken into a 3 lit separable flask fitted with a thermometer, an agitator, a reflux cooling tube, a nitrogen inlet pipe and a dropping funnel. Into this mixture 1570 parts of acetone and 60.1 parts of 1,2-naphthoquinone diazido-5-sulfonyl chloride were added, and the resulting mass was agitated throughly at room temperature. Into the resulting mixture, 26.7 parts of triethylamine were added dropwise over an hour, and reaction was continued for further two hours. The produced solution was filtered to remove impurities. The resulting mass was added dropwise over about one hour into a 20-fold quantity of well-agitated water and precipitated resins were recovered. After removal of the moisture under reduced pressure, a brownish cationic positive type photosensitive resin (A-5) was produced.

SYNTHESIS EXAMPLE 12

Synthesis of Anionic Positive Type Photosensitive Resin (A-6)

Synthesis of Anionic Resin (a-4)

1,000 g of "NISSEKI POLYBUTADIENE B-1000" (manufactured by NIPPON PETROCHEMICALS CO., LTD.; number average molecular weight, 1,000; iodine value, 430; content of 1,2-linkage, 65%), 751 g of maleic anhydride, 10 g of xylene and 5.0 g of trimethyl hydroquinone, were charged into a 3 lit separable flask fitted with a thermometer, an agitator, a reflux cooling tube and a nitrogen blowing pipe, and reaction was carried out at 190° C. for 5 hours under nitrogen. After non-reacted maleic anhydride and xylene were distilled off, maleinated polybutadiene with a total acid value of 480 mg KOH/G was produced.

Then, 500 g of the maleinated polybutadiene) 218 g of phenoxyethanol and 205 g of diethylene glycol dimethyl ether were charged into a 2 lit separable flask fitted with a reflux cooling tube, and dissolved homogeneously. Reaction was then carried out under nitrogen at 130° C. for three hours. Then, 61 g of benzylamine were added dropwise for 30 minutes at the same temperature and the temperature was raised to 165° C. Reaction was carried out at this temperature for seven hours to produce a solution of an anionic resin (a-4) containing half ester and imide groups.

Synthesis of Photosensitive Resin (a-5)

1000 g of "NISSEKI POLYBUTADIENE B-1000" (manufactures by NIPPON PETROCHEMICALS CO., LTD.; number average molecular weight, 1,000;

iodine value, 430; content of 1,2-linkage, 65%), 388 g of maleic anhydride, 10 g of xylene and 3.0 g of trimethyl hydroquinone were charged into a 3 lit separable flask fitted with a thermometer, an agitator, a reflux cooling tube and a nitrogen blowing pipe, and reaction was carried out at 190° C. for 5 hours under nitrogen. After non-reacted maleic anhydride and xylene were distilled off, maleinated polybutadiene with a total acid value of 320 mg KOH/G was produced.

Then, 500 g of the maleinated polybutadiene and 300 g of phenoxyethanol were charged into a 2 lit separable flask fitted with a thermometer, an agitator, a reflux cooling tube and a nitrogen blowing tube and dissolved homogeneously. Reaction was then carried out under nitrogen at 130° C. for three hours. After cooling to room temperature, 149 g of 2-(2-aminoethylamino)ethanol were added dropwise over an hour. The temperature was then raised to 125° C., at which temperature the reaction was carried out for four hours to produce a solution of polyamine resin containing imido groups.

Into a 5 lit separable flask fitted with a reflux cooling tube were charged 269 g of 1,2-naphthoquinone azido sulfonyl chloride, 1900 g of dioxane and 300 g of "KYOWAAD 1000" manufactured by KYOUWA CHEMICAL IND.. Then, 645 g of the polyamine resin solution were added dropwise at 30° C. over two hours and reaction was carried out at this temperature further for five hours. After the produced solution was filtered, 440 g of phenoxy ethanol was added and dioxane was removed under reduced pressure to produce a photosensitive resin (a-5).

The produced resin (a-5) in solution contained 150 mg equivalent of naphthoquinone diazido groups per 100 g of resin, and the non-volatile content amounted to 60.0 wt. %.

Synthesis of Anionic Positive Type Photosensitive Resin (A-6)

750 g of the above mentioned (a-4) resin solution and 670 g of the photosensitive resin (a-5) solution were mixed thoroughly and 60 g of triethylamine was added for neutralization sufficiently to produce an anionic positive type photosensitive resin (A-6) solution.

SYNTHESIS EXAMPLE 13

Synthesis of Cationic Resin (A-7)

Synthesis of Amine-Added Epoxidated Polybutadiene (a-6)

1000 g of epoxidated liquid polybutadiene (manufactured by NIPPON PETROCHEMICALS CO., LTD. under the trade name of "E-1000-8"; number average molecular weight, 1000; oxirane content, 8%) were charged into a 2 lit separable flask fitted with a thermometer, an agitator and a reflux cooling pipe. After the atmosphere in the system was replaced by nitrogen, 231.2 g of methyl ethanol amine were added and reaction was carried out at 170° C. for five hours. Non-reacted methylethanol amine was distilled off to produce an amine-added epoxidated polybutadiene (a-6) having an amine value of 230.4 mmol/100 g.

Synthesis of Unsaturated Group-Containing Isocyanate (a-7)

Into a 2 lit round-bottomed flask, which might be heated and cooled, and which was fitted with a thermometer, an agitator, a reflux cooling pipe and a dropping funnel, 435.5 g of 2,4-tolylene diisocyanate and 266.1 g of diethylene glycol dimethyl ether were charged. After heated to 40° C., 362.8 g of 2-hydroxyethyl acrylate was added dropwise. Simultaneously, 200 ppm of p-benzoquinone was added. Since heat evolution was noticed by dropwise addition of 2-hydroxyethyl acrylate, the system was cooled occasionally to maintain a constant temperature. After the end of dropwise addition of 2-hydroxyethyl acrylate, the temperature was raised to 70° C., at which temperature the reaction was carried out for three hours. After confirming by IR absorption spectral analyses that absorption intensity of the isocyanate groups was reduced to about one half that before start of the reaction, the reaction system was cooled to produce an unsaturated group-containing isocyanate compound (a-7).

Synthesis of Cationic Resin (A-7)

500 g of (a-6) was dissolved in 166.7 g of diethylene glycol dimethyl ether in a 2 lit separable flask. 713.4 g of (a-7) (corresponding to 0.8 equivalent of the isocyanate groups to 1 equivalent of hydroxyl groups in (a-6)) were added dropwise to the resulting solution at 40° C., at which temperature the reaction was carried out for one hour. After confirming by IR absorption spectral analyses that absorption of the isocyanate groups disappeared, the reaction was terminated to obtain a cationic resin (A-7) which was an addition product of (a-7) to (a-6).

SYNTHESIS EXAMPLE 14

Preparation of Positive Type Photosensitive Coating (B-4)

500 g of the cationic positive type photosensitive resin (A-5.), obtained in Synthesis Example 11, were dissolved in 333.3 g of methylethyl ketone. To the resulting mixture, 11.7 g of acetic acid were added as a neutralizer and agitated thoroughly. After re-homogenization, de-ionized water was added gradually to the homogenized mass, and the resulting mixture was agitated vigorously to effect dispersion in water to prepare an aqueous solution of a positive type photosensitive coating (B-4) having a solid concentration of 15 wt % (cationic electrodeposition type).

SYNTHESIS EXAMPLE 15

Synthesis of Positive Type Photosensitive Coating (B-5)

500 g of the cationic positive type photosensitive resin (A-5), produced in Synthesis Example 11, were dissolved and diluted in methylethyl ketone to have a solid content concentration of 40 wt % to produce a positive type photosensitive coating solution (B-5).

SYNTHESIS EXAMPLE 16

Preparation of Positive Type Photosensitive Coating (B-6)

To 500 g of the anionic positive type photosensitive resin (A-6) solution obtained in Synthesis Example 12, de-ionized water was added gradually and the resulting mass was agitated vigorously by a high-speed mixer to effect dispersion in water to prepare an aqueous solution of a positive type photosensitive coating (B-6) having a solid concentration of 15 wt % (anionic electrodeposition type).

SYNTHESIS EXAMPLE 17

Preparation of Colored Coatings (C-7, C-8 and C-9)

A solution of the cationic resin (A-7), a photopolymerization initiator and a pigment were mixed under agitation and dispersed by a laboratory type three-roll roll mill, manufactured by KODAIRA SEISAKUSHO KK, untill the particle size was 0.2 μm or less. The particle size was measured using a COULTER counter N4 manufactured by COULTER INC. To each of the produced mixtures in solution was added acetic acid as a neutralizer and each of the resulting mixtures was agitated thoroughly. After re-homogenization, de-ionized water was added gradually to each of the homogenized masses and the resulting mixture was agitated vigorously by a high-speed mixer to effect dispersion in water to prepare each of Colored coatings (C-7, C-8 and C-9) having a solid concentration of 10 wt %. Table 3 shows the compositions of the aqueous solutions of the produced three color colored coatings (cationic electrodeposition type). Meanwhile, figures in the Table stand for parts by weight.

TABLE 2

| Coating<br>Color | C-7<br>Red | C-8<br>Green | C-9<br>Blue |
|---|---|---|---|
| Cationic resin (A-7) solution | 213.3 | 213.3 | 213.3 |
| IRGACUE 907 (note 1) | 11.5 | 11.5 | 11.5 |
| KAYACURE DETX (note 2) | 1.3 | 1.3 | 1.3 |
| Acetic acid (neutralizer) | 19.8 | 19.8 | 19.8 |
| Phthalocyanine blue (note 3) | — | — | 20 |
| Photoalocyanine green (note 4) | — | 20 | — |
| Azo metal salt red pigment (note 5) | 20 | — | — |

(note 1) Manufactured by CIBA GEIGY INC., trade name
(note 2) Manufactured by NIPPON KAYAKU CO., LTD. trade name
(note 3) "SR-150C" manufactured by SANYO SHIKIS KK
(note 4) "SAX" manufactured by SANYO SHIKISO KK
(note 5) "PIGMENT RED 4BS" manufactured by SANYO SHIKISO KK

EXAMPLE 1

Using a copper-clad glass epoxy laminated plate having a smoothly polished surface, referred to hereinafter as a master plate 1 as a cathode, and also using a stainless steel beaker filled with an aqueous solution of a photosensitive coating (B-1) as an anode, electrodeposition was carried out for three minutes under conditions of a dc voltage of 30 V and a temperature of 25° C. The master plate 1 was washed with ion-exchanged water, dried at 80° C. for 5 minutes and cooled. It was found that a non-tacky uniform coating film was formed to have a thickness of 2 μm.

A mask having patterns of four different degrees of light transmittances as shown in FIG. 2 was applied intimately to the coating film, and irradiated with UV rays of 200 mJ/cm², using a UV exposure device fitted with a high pressure mercury lamp manufactured by ORC MANUFACTURING CO., LTD. under the trade name of "JL-3300". After development with an aqueous solution of tactic acid with a concentration of 0.05 wt %, the photosensitive coating was selectively removed in a region in register with the lowest light transmittance mask region for laying the copper surface to outside. After washing with water and drying, a dc voltage of 30 V was applied at 25° C. for 3 minutes for electrodeposition, using the master plate 1 as an anode and using a stainless steel beaker containing the colored coating (C-1) as a cathode. After the master plate 1 was washed with ion-exchanged water and dried at 80° C. for 5 minutes, a red colored layer with a film thickness of 2 μm, which was not tacky at room temperature, was formed. After development with a 0.5 wt % aqueous solution of tactic acid, no change was noticed in the red colored layer or in the photosensitive coating region which was to be a light-intercepting film region, while the photosensitive coating was selectively removed in a region in register with the second lowest transmittance mask region. After washing with water and drying, the colored coating (C-2) was electrodeposited for 3 minutes under conditions of a dc voltage of 30 v and a temperature of 25° C. After washing with ion-exchanged water, it was found that no change was seen in the previously formed red colored layer or the photosensitive coating region which was to be the light-intercepting film region, while a green colored layer was formed. After drying at 80° C. for 5 minutes, and development with a 3.0 wt % aqueous solution of tactic acid, no change was seen in the red and green colored layers or in the photosensitive coating region, while the photosensitive coating region in register with the third lowest transmittance mask region was selectively removed. After washing with water and drying, the colored coating (C-3) was electrodeposited for 3 minutes under conditions of 30° C. and a dc voltage of 25 V in the same manner as when electrodepositing the colored coating (C-1). After the master plate 1 was washed with ion-exchanged water, no change was seen in the previously formed red and green colored layers or in the photosensitive coating region which was to be the light-intercepting film region, while a blue colored layer was formed. After drying at 80° C. for 5 minutes, the colored layers with the light-intercepting film region were formed.

After development with a 7.0 wt % aqueous solution of tactic acid, no change was seen in the colored layers, and the photosensitive coating was removed in a residual region corresponding to the light-intercepting film region. With the exposed copper surface as a cathode, electroplating was carried out in a Ni plating bath at 45° C. for 3 minutes with a current density of 0.1 A/cm². After washing with water and drying, the master plate 1 having the colored layers and a non-light transmitting or light-intercepting Ni layer was produced.

Then, on a transparent substrate, on which the Ni layer and the colored layers were to be transcribed, the UV curable photosensitive adhesive prepared in Synthesis Example 10, was applied by spin coating to have a film thickness of 0.5 μm. After irradiation with UV rays of 100 mJ/cm², the master plate 1 was pressure contacted with the substrate by a rubber roll so that the colored layers on the master plate were brought into contact with the adhesive to transcribe the colored layers onto the transparent substrate. The colored layers were baked to the substrate at 160° C. for 30 minutes for completing the curing. After curing, the colored layers and the Ni layers were each 1.9 μm in thickness, and a color filter having uniform colored layers and excellent transparency was produced.

EXAMPLE 2

Using a polyethylene terephthalate film with a thickness of 0.3 mm having an indium-tin oxide (ITO) film with a thickness of 80 nm on its surface, referred to hereinafter as a master plate 2 as an anode, and a stainless steel beaker containing an aqueous solution of the photosensitive coating (B-3) as a cathode, electrodeposition was carried out for 3 minutes under conditions of a dc voltage of 25 V at 25° C. After washing with ion-exchanged water, the master plate 2 was dried at 80° C. for 5 minutes and cooled. It was now found that a non-tacky uniform coating film was formed to have a film thickness of 1.8 μm.

Then, a mask having patterns of four different degrees of light transmittances as shown in FIG. 2 was intimately contacted with the coating film and irradiate with UV rays of 200 mJ/cm$^2$ using a UV exposure device as in Example 1. After development with a 0.1 wt % aqueous solution of sodium carbonate, the photosensitive coating was selectively removed in a region in register with the lowest transmittance mask region to lay the ITO film to outside. After washing with water and drying, electrodeposition was carried out for 3 minutes under conditions of a dc voltage of 30 V at 25° C., using the master plate 2 as a cathode and using a stainless steel beaker containing the colored coating (C-4) as an anode. After washing the master plate 2 with ion-exchanged water and drying at 80° C. for 5 minutes, a red colored layer was formed. After development with a 0.75 wt % aqueous solution of sodium carbonate, no change was seen in the red colored layer or in the photosensitive coating region which was to be a light-intercepting film region, while the photosensitive coating region in register with the second lowest transmittance mask region was selectively removed. After washing with water and drying, the colored coating (C-5) was electrodeposited for 3 minutes under conditions of a dc voltage of 30 V at 25° C., and subsequently the master plate 2 was washed with ion-exchanged water. It was found that a green colored layer was now formed, while no change was seen in the previously formed red colored layer or in the photosensitive coating which was to be the light-intercepting film region. After drying at 80° C. for 5 minutes followed by development with a 5 wt % aqueous solution of sodium metasilicate, no change was seen in the red and green colored layers or in the photosensitive coating region which was to be the light-intercepting film region, while the photosensitive coating region in register with the third lowest transmittance mask region was selectively removed. After washing with water and drying, the colored coating (C-6) was electrodeposited for 3 minutes under conditions of a dc voltage of 30 V at 25° C., as when electrodepositing the colored coating (C-4). After washing the master plate 2 with ion-exchanged water, no change was seen in the previously formed red and green colored layers or in the photosensitive coating region which was to be the light-intercepting film region, but a blue colored layer was formed. After drying at 80° C. for 5 minutes, the colored layers having the light-intercepting film region were produced.

After development with a 7.0 wt % aqueous solution of sodium metasilicate, no change was noticed in the colored layers, while only the remaining region of the photosensitive coating corresponding to the light-intercepting film region was selectively removed. Using the exposed ITO surface as a cathode, electro-plating was carried out for 2.5 minutes in a copper plating bath of 45° C. at a current density of 0.1 A/cm$^2$. After washing with water and drying, the master plate 2 having the colored layers and the non-light transmitting or light-intercepting copper layer was produced.

The master plate 2 was pressed by a rubber roll against a transparent glass substrate, so that the colored layers of the master plate 2 were contacted with the substrate for transcribing the copper layer and the colored layers. The master plate 2 was then peeled off. The copper and colored layers were baked to the substrate at 160° C. for 30 minutes to complete curing. After curing, a color filter having uniform colored layers and excellent in transparency could be obtained with the film thicknesses of the color layers and copper layers each being 1.8 μm.

EXAMPLE 3

The photosensitive coating solution (B-2) was spray coated on the same glass substrate as that use in Example 1 and air-dried. After drying at 80° C. for 5 minutes, a non-tacky uniform coating film having a film thickness of 1.9 μm was formed.

Then, a mask having patterns of four different degrees of transmittances shown in FIG. 2 was intimately contacted with the coating film, and irradiated with UV rays of 200 mJ/cm$^2$, using a UV light exposure device manufactured and sold under the trade name of "JL-3300" by ORC MANUFACTURING CO., LTD. The subsequent development, electrodeposition and plating steps were carried out in the same manner as in Example 1 to produce a color filter having uniform color layers with a film thickness of 1.9 μm and excellent transparency.

EXAMPLE 4

Using a copper-clad glass epoxy laminated plate having a smoothly ground surface, referred to hereinafter as a master plate 4, as a cathode, and using a stainless steel beaker containing an aqueous solution of the positive type photosensitive coating (B-4) as an anode, electrodeposition was carried out for 60 seconds under conditions of a dc voltage of 40 V at 25° C. After washing the master plate 4 with ion-exchanged water followed by drying at 80° C. for 5 minutes and cooling, a non-tacky uniform coating film with a film thickness of 2 μm was formed.

A mask having patterns of four different degrees of transmittances as shown in FIG. 3 was intimately contacted with the coating film, and irradiated with UV rays of 200 mJ/cm$^2$, using a UV light exposure device fitted with a high pressure mercury lamp manufactured and sold by ORC MANUFACTURING CO., LTD. under the trade name of "JL-3300". Then, after development with a 0.3 wt % aqueous solution of sodium metasilicate, the positive photosensitive coating film region in register with the maximum transmittance mask region was selectively removed for laying the copper surface to outside. After washing with water and drying, a dc voltage of 25 V was applied at 25° C. for 3 minutes for electrodeposition, using the master plate 4 as an anode and a stainless steel beaker containing the colored coating (C-1) as a cathode. After washing the master plate 4 with ion-exchanged water and drying at 80° C. for 5 minutes, a red colored layer which was riot tacky at room temperature and which was 2 μm in thickness was formed. Then, after development with a 1.3 wt % aqueous solution of sodium metasilicate, no change was noticed in the red colored layer or in the positive type photosensitive coating region which was to be the light-intercepting film region, while the positive photosensitive film portion in register with the second highest transmittance mask region was selectively removed. After washing with water and drying, the colored coating (C-2) was electrodeposited for 3 minutes under conditions of a de voltage of 25 V and a temperature of 25° C., as in the case of electrodeposition of the colored coating (C-1). After washing with ion-exchanged water, no change was produced in the previously formed red colored layer or in the positive photosensitive coating film region corresponding to the light-intercepting film region, but a green colored layer was formed. After drying at 80° C. for 5 minutes followed by development with a 3.0 wt % aqueous solution of sodium metasilicate, no change was noticed in the red or green colored layer or in the positive photosensitive coating film region corresponding to the light-intercepting film region, but the positive photosensitive coating film region in register with the third highest transmittance mask region was selectively removed. Then, after washing with water and drying, the colored coating (C-3) was electrodeposited for 3 minutes under conditions of a dc voltage of 25 V and a temperature of 30° C. in the same manner as when electrodepositing the colored coating (C-1). After washing the master plate 4 with ion-exchanged water, no change was seen in the previously formed red or green colored layers or in the positive photosensitive coating film region corresponding to the light-intercepting film region, but a blue colored layer was formed. After drying at 80° C. for 5 minutes, the master plate 4 having colored layers and the light-intercepting film region was produced.

Then, after development with a 7.0 wt % aqueous solution of sodium metasilicate, no change was noticed in the colored layers, but only the positive photosensitive coating film region corresponding to the light-intercepting film region was selectively removed. Using the exposed copper surface as a cathode, electro-plating was carried out for 3 minutes in a Ni plating bath of 45° C., at a current density of 0.1 A/cm². After washing with water and drying, the master plate 4 having a non-light transmitting or light-intercepting Ni layer and the colored layers was produced.

Then, on a transparent substrate, on which the produced colored layers and the Ni layer were to be transferred, the UV curable pressure sensitive adhesive prepared in Synthesis Example 10, was applied by a spin coating method to have a film thickness of 0.5 μm, and irradiated with UV rays at 60 mJ/cm². The master plate 4 was pressed against the transparent substrate by a rubber roll so that the colored layers on the master plate 4 were contacted with the adhesive for transcribing the colored layers and the Ni layer onto the transparent substrate. The master plate 4 was then peeled off. The colored and Ni layers were baked to the substrate at 160° C. for 30 minutes to complete curing. After curing, a color filter having uniform colored layers with excellent transparency was produced with the color layers and the light-intercepting layer being each 1.9 μm in thickness.

EXAMPLE 5

Using a polyethylene terephthalate film, 0.3 mm in thickness, having on its surface an indium-tin oxide (ITO) film 80 nm in thickness, referred to hereinafter as a master plate 5, as an anode, and a stainless steel beaker containing an aqueous solution of a positive photosensitive coating (B-6) as a cathode, electrodeposition was carried out for 2 minutes under conditions of a dc voltage of 45 V and a temperature of 25° C. After washing the master plate 5 with ion-exchanged water followed by drying at 80° C. for 5 minutes and cooling, a nontacky uniform coating with a film thickness of 1.8 μm was formed.

A mask having patterns of four different degrees of light transmittances, as shown in FIG. 3, was intimately contacted with the coating film, and irradiated with UV rays of 200 mJ/cm², using a UV exposure device, in the same manner as in Example 1. Then, after development with a 0.5 wt % aqeuous solution of sodium metasilicate, the positive photosensitive coating film in register with the maximum transmittance positive mask region was selectively removed for laying the ITO to outside. After washing with water and drying, electrodeposition was carried out for three minutes under conditions of a dc voltage of 30 V and a temperature of 25° C., using the master plate 5 as a cathode and a stainless steel beaker containing the colored coating (C-7) as an anode. After washing the master plate 5 with ion-exchanged water and drying at 80° C. for 5 minutes, a red colored layer was formed. Then, after development with a 1.5 wt % aqueous solution of sodium metasilicate, no change was noticed in the red colored layer or in the positive photosensitive coating film region corresponding to the light-intercepting film region, while the positive photosensitive coating film region in register with the second highest transmittance mask region was selectively removed. After washing with water and drying, the colored coating (C-8) was electrodeposited for 3 minutes under conditions of a dc voltage of 30 V and a temperature of 25° C., in the same manner as when electrodepositing the colored coating (C-7). After washing the master plate 5 with ion-exchanged water, no change was seen in the previously formed red colored layer or in the positive photosensitive coating film region corresponding to the light-intercepting film region, but a green-colored layer was formed. After drying at 80° C. for 5 minutes followed by development in a 4 wt % aqueous solution of sodium metasilicate, no change was noticed in the red or green colored layer or in the positive photosensitive coating film region corresponding to the light-intercepting film region, but the positive photosensitive coating film portion in register with the third highest transmittance mask region was selectively removed. After washing with water and drying, the colored coating (C-9) was electrodeposited for 3 minutes, under conditions of a dc voltage of 30 V at 25° C., in the same manner as when electrodepositing the colored coating (C-7). After washing the master plate 5 with ion-exchanged water, no change was seen in the previously formed red or green colored layer or in the positive photosensitive coating film region corresponding to the light-intercepting film region, but a blue colored layer was formed. After drying at 80° C. for 5 minutes, the colored layers having the light-intercepting film region were obtained.

After development with a 7.0 wt % aqueous solution of sodium metasilicate, no change was seen in the colored layers, but the positive photosensitive coating film region corresponding to the light-intercepting film region was selectively removed. Using the exposed ITO surface as a cathode, electro-plating was carried out for 2.5 minutes in a Cu plating bath at 45° C. at a current density of 0.1 A/cm². After washing with water and drying, the master plate 5 having a non-light transmitting or light-intercepting Cu layer and the colored layers was produced.

The master plate 5 was then pressed against a transparent glass substrate by a rubber roll, so that the colored layers on the master plate 5 were contacted with the glass substrate. After irradiation with UV rays of 300 mJ/cm², the master plate 5 was peeled off. The colored layers and the Cu layer were baked to the glass substrate at 160° C. for 20 minutes to complete curing.

After the curing, a color filter haivng uniform colored layers excellent in transparency was produced, with the colored layers and the Cu layer each being 1.8 μm in thickness.

EXAMPLE 6

A positive photosensitive coating solution (B-5) was applied to the same substrate as that used in Example 4 by spin coating and air-dried. After drying at 80° C. for 5 minutes, a non-tacky uniform coating film having a film thickness of 1.9 μm, was obtained.

The mask shown in FIG. 3 was intimately contacted with the coating film surface, and irradiated with UV rays of 200 mJ/cm$^2$, using a UV exposure device fitted with a high pressure mercury lamp manufactured and sold by ORC MANUFACTURING CO., LTD., under the trade name of "JL-3300". The developing, electrodepositing and the plating steps were carried out in the same manner as in Example 4 to produce a color filter having uniform colored layers with excellent transparency having a film thickness of 1.9 μm.

Although the present invention has been described with reference to the preferred examples, it should be understood that various modifications and variations can be easily made by those skilled in the art without departing from the spirit of the invention. Accordingly, the foregoing disclosure should be interpreted as illustrative only and is not to be interpreted in a limiting sense. The present invention is limited only by the scope of the following claims.

We claim:

1. A method for producing a color filter comprising the steps of:
   (A) forming a photosensitive coating film on an electrically conductive layer formed on a surface of a substrate, and exposing said photosensitive coating film through a mask having patterns of at least three different degrees of light transmittances;
   (B) developing and removing a photosensitive coating film portion corresponding to a pattern selected from the group consisting of a pattern having the smallest degree of light transmittance and a pattern having the largest degree of light transmittance for exposing said electrically conductive layer and electrodepositing a colored coating on the exposed electrically conductive layer for forming a colored layer thereon, operation of developing and removing the photosensitive coating film followed by electrodeposition being repeated for the respective patterns having different degrees of light transmittances in one sequence selected form the group consisting of increasing light transmittance and decreasing light transmittance for producing different colored layers, respectively;
   (C) selectively forming a metal layer interstices present between the colored layers, and
   (D) transcribing said colored layers and said metal layer onto another substrate.

2. A method as claimed in claim 1 wherein said photosensitive coating film is formed by a method selected from the group consisting of electrodeposition, spraying, dip coating, roll coating, screen printing and spin coating.

3. A method as claimed in claim 1 wherein said photosensitive coating film is formed of a negative photosensitive coating containing a negative photosensitive coating resin exhibiting coating film forming capability and photosensitivity, a photopolymerization initiator and a solvent selected from the group consisting of an organic solvent and water.

4. A method as claimed in claim 3 wherein said negative type photosensitive coating resin has a molecular weight ranging between 500 and 10,000.

5. A method as claimed in claim 3 wherein said negative photosensitive coating resin is a prepolymer selected from the group consisting of epoxy (meth)acrylate, urethane (meth)acrylate, polyester (meth)acrylate and mixtures thereof.

6. A method as claimed in claim 3 wherein said negative photosensitive coating resin is a cationic resin prepared by introducing (i) a member selected from the group consisting of an amino group, an ammonium group, a sulfonium group, and mixtures thereof and (ii) a photosensitive group into a main resin and neutralizing with an acidic material, said main resin being selected from the group consisting of acrylic resin, polyester resin, maleinated oil resin, epoxy resin, urethane resin, polybutadiene resin, polyamide resin and mixtures thereof, said photosensitive group being selected from the group consisting of an acryloyl group, a methacryloyl group, a cinnamoyl group and mixtures thereof, and said acidic material being selected from the group consisting of formic acid, acetic acid, propionic acid, lactic acid and mixtures thereof.

7. A method as claimed in claim 3 wherein said negative photosensitive coating resin is a carboxyl group-containing anionic resin obtained by introducing a carboxyl group and a photosensitive group into a main resin and neutralizing with a basic substance, said main resin being selected from the group consisting of acrylic resin, polyester resin, maleinated oil resin, polybutadiene resin, epoxy resin, urethane resin, polyamide resin and mixtures thereof, said photosensitive group being selected from the group consisting of an acryloyl group, a methacryloyl group, a cinnamoyl group and mixtures thereof, said basic substance being selected from the group consisting of triethylamine, diethylamine, dimethylethanol amine, ammonia and mixtures thereof.

8. A method as claimed in claim 3 wherein said photopolymerization initiator is selected from the group consisting of benzoins, benzoin ethers, benzilalkyl ketals, benzophenone, anthraquinone, thioxanthone and mixtures thereof.

9. A method as claimed in claim 3 wherein an added amount of said photopolymerization initiator is 0.1 to 30 parts by weight to 100 parts by weight of said negative photosensitive coating resin.

10. A method as claimed in claim 3 wherein said organic solvent is selected from the group consisting of ethyleneglycol monobutyl ether, ethyleleglycol monohexyl ether, ethyleneglycol monophenyl ether, propyleneglycol monomethyl ether, propylneglycol monophenyl ether, diethyleneglycol dimethyl ether, triethyleneglycol dimethyl ether, acetone, methylethyl ketone, methylisobutyl ketone, cyclohexanone, isophorone, dibutyl ether, dioxane, tetrahydrofuran, methoxy butanol, diacetone alcohol, butanol, isopropanol, toluene, xylene, hexane, ethyl acetate, butyl acetate, 2-methoxyethyl acetate, 2-methoxypropyl acetate, ethyl benzoate, dimethyl formamide, N,N-dimethyl acetoamide, dimethyl sulfoxide and mixtures thereof.

11. A method as claimed in claim 3 wherein said negative photosensitive coating contains a colorant selected from the group consisting of dyes, pigments and mixtures thereof.

12. A method as claimed in claim 11 wherein said dye is selected from the group consisting of azo dyes, anthraquinone dyes, benzodifuranone dyes, condensed methine dyes and mixtures thereof.

13. A method as claimed in claim 11 wherein said pigment is selected from the group selected from the group consisting of azo lake organic pigments, quinacridone organic pigments, phthalocyanine organic pigments, isoindolinone organic pigments, anthraquinone organic pigments, thioindigo organic pigments, chrome yellow, iron oxide, chrome vermilion, chome green, ultramarine, prussian blue, cobalt blue, cobalt green, emerald green, titanium white, carbon black and mixtures thereof.

14. A method as claimed in claim 11 wherein said colorant is used in an amount of 3 to 70 wt. % based on a total amount of the negative photosensitive coating.

15. A method as claimed in claim 1 wherein said photosensitive coating film is formed of a positive photosensitive coating containing a positive photosensitive coating resin having coating film forming capability and photosensitivity and a solvent selected from the group consisting of an organic solvent and water.

16. A method as claimed in claim 15 wherein said positive photosensitive coating resin is a quinone diazido group containing cationic resin obtained by introducing (i) a member selected from the group consisting of an amino group, an ammonium group, a sulfonium group, and mixtures thereof, and (ii) a hydroxyl group into a main resin, adding a quinone diazido sulfonic acid compound by esterification reaction and neutralizing with an acidic material, said main resin being selected from the group consisting of acrylic resin, polyester resin, maleinated oil resin, polybutadiene resin, epoxy resin, urethane resin, polyamide resin and mixtures thereof, and said acid material being selected from the group consisting of formic acid, acetic acid, propionic acid, lactic acid, and mixtures thereof.

17. A method as claimed in claim 15 wherein said positive photosensitive coating resin is a quinone diazido group-containing anionic resin obtained by introducing a carboxyl group and a hydroxyl group into a main resin, adding a quinone diazido sulfonic acid compound by esterification reaction and neutralization with a basic substance, said main resin being selected from the group consisting of acrylic resin, polyester resin, maleinated oil resin, polybutadiene resin, epoxy resin, urethane resin, polyamide resin and mixtures thereof, and said basic substance being selected from the group consisting of triethylamine, diethylamine, dimethylethanol amine, ammonia and mixtures thereof.

18. A method as claimed in claim 15 wherein said positive photosensitive coating resin is a quinone diazido group-containing resin obtained by reacting a resin having film forming capability and a hydroxyl group-containing compound with a quinone diazido compound, said quinone diazido compound being selected from the group consisting of a quinone diazido sulfonic acid derivative-containing quinone diazido compound and an isocyanate group-containing quinone diazido compound.

19. A method as claimed in claim 15 wherein said organic solvent is selected from the group consisting of ethyleneglycol monobutyl ether, ethylglycol monohexyl ether, ethyleneglycol monophenyl ether, propyleneglycol monomethyl ether, propyleneglycol monophenyl ether, diethyleneglycol dimethyl ether, triethyleneglycol dimethyl ether, acetone, methylethyl ketone, methylisobutyl ketone, cyclohexanone isophorone, dibutyl ether, dioxane, tetrahydrofuran, methoxy butanol, diacetone alcohol, butanol, isopropanol, toluene, xylene, hexane, ethyl acetate, butyl acetate, 2-methoxyethyl cetate, 2-methoxypropyl acetate, ethyl benzoate, dimethylformamide, N,N-dimethyl acetoamide, dimethyl sulfoxide and mixtures thereof.

20. A method as claimed in claim 15 wherein said positive photosensitive coating contains a colorant selected from the group consisting of dyes, pigments and mixtures thereof.

21. A method as claimed in claim 20 wherein said dye is selected from the group consisting of azo dyes, anthraquinone dyes, benzodifuranone dyes, condensed methine dyes and mixtures thereof.

22. A method as claimed in claim 20 wherein said pigment is selected from the group consisting of azo lake organic pigments, quinacridone organic pigments, phthalocyanine organic pigments, isoindolinone organic pigments, anthraquinone organic pigments, thioindigo organic pigments, chrome yellow, iron oxide, chrome vermilion, chrome green, ultramarine, prussian blue, cobalt blue, cobalt green, emerald green, carbon black and mixtures thereof.

23. The method as claimed in claim 20 wherein 3 to 70 wt. % of said colorant is contained based on total weight of said positive photosensitive coating.

24. A method as claimed in claim 1 wherein said mask is a negative mask and wherein said sequence is in an order of increasing light transmittances.

25. A mask as claimed in claim 1 wherein said mask is a positive mask and wherein said sequence is in an order of decreasing light transmittances.

26. A method as claimed in claim 1 wherein said photosensitive coating film is developed and removed by a developing solution selected from the group consisting of an aqueous solution containing an acidic material dissolved therein, an aqueous solution containing a basic material dissolved therein, alcohols, glycol ethers, ketones and chlorinated hydrocarbons.

27. A method as claimed in claim 26 wherein said acidic material is selected from the group consisting of formic acid, acetic acid, propionic acid, lactic acid, hydrochloric acid, phosphoric acid and mixtures thereof.

28. A method as claimed in claim 26 wherein said basic material is selected from the group consisting of sodium carbonate, sodium hydrogen carbonate, sodium metasilicate, tetraalkyl ammonium hydroxide, sodium hydroxide, potassium hydroxide and mixtures thereof.

29. A method as claimed in claim 1 wherein said photosensitive coating film is developed and removed under conditions of a temperature of 10° to 70° C. and a developing time of 5 to 600 seconds.

30. A method as claimed in claim 1 wherein said colored coating is obtained by neutralizing a film-forming component and a colorant component with a material selected from the group consisting of an acidic substance and a basic substance, said film-forming component being selected from the group consisting of cationic resins, anionic resins and photocurable resins, said colorant component being selected from the group consisting of dyes, pigments and mixtures thereof, said acidic substance being selected from the group consisting of formic acid, acetic acid, propionic acid, lactic acid and mixtures thereof, and said basic substance being selected from the group consisting of triethylamine, diethylamine, diethylethanol amine, ammonia and mixtures thereof.

31. A method as claimed in claim 30 wherein said cationic resin is obtained by introducing (i) a member selected from the group consisting of an amino group, an ammonium group, a sulfonium group, and mixtures thereof into a main resin, said main resin being selected from the group consisting of acrylic resin, polyester resin, maleinated oil resin, epoxy resin, urethane resin, polybutadiene resin, polyamide resin and mixtures thereof.

32. A method as claimed in claim 30 wherein said anionic resin is obtained by introducing a carboxyl group into a main resin selected from the group consisting of acrylic resin, polyester resin, maleinated oil resin, polybutadiene resin, epoxy resin, urethane resin, polyamide resin and mixtures thereof.

33. A method as claimed in claim 30 wherein said photocurable resin contains a functional group selected from the group consisting of an acryloyl group, a methacryloyl group, a cinnamoyl group and mixtures thereof in a molecule thereof.

34. A method as claimed in claim 30 wherein said photocurable resin comprises a photopolymerization initiator selected from the group consisting of benzoins, benzoin ethers, benzilalkyl ketals, benzophenone, anthraquinone, thioxanthone and mixtures thereof.

35. A method as claimed in claim 30 wherein said dye is selected from the group consisting of azo dyes, anthraquinone dyes, benzodifuranone dyes, condensed methine dyes and mixtures thereof.

36. A method as claimed in claim 30 wherein said pigment is selected from the group consisting of azo lake organic pigments, quinacridone organic pigments, phthalocyanine organic pigments, isoindolinone organic pigments, anthraquinone organic pigments, thioindigo organic pigments, chrome yellow, iron oxide, chrome vermilion, chrome green, ultramarine, prussian blue, cobalt blue, cobalt green, emerald green, titanium white, carbon black and mixtures thereof.

37. A method as claimed in claim 1 wherein said colored coating is electrodeposited at an electrical voltage of 5 to 500 V dc for a time interval of 5 to 300 seconds and at a liquid temperature of 10° to 35° C.

38. A method as claimed in claim 1 wherein said another substrate is a transparent substrate made of a material selected from the group consisting of glass, polyester, polysulfone, triacetyl cellulose, polycarbonate, polyimide, polystyrene and polymethyl pentene.

39. A method as claimed in claim 1 wherein in said step (B) said photosensitive coating film corresponding to a pattern selected from the group consisting of a pattern having smallest degree of light transmittance and a pattern having largest degree of light transmittance and that portion other than the patterns is developed and removed to expose the electrically conductive layer and wherein in said step (C) said metal layer is formed on the exposed electrically conductive layer.

40. A method as claimed in claim 1 wherein a metal of said metal layer is selected from the group consisting of copper, nickel, chromium, silver, gold, an alloy thereof and mixtures thereof.

41. A method as claimed in claim 1 wherein said step (D) is carried out under conditions of a transcription temperature ranging from room temperature to 150° C., a transcription pressure of 0.05 to 10 kgf/cm$^2$ and a transcription time of 2 seconds to 1 hour.

42. A method as claimed in claim 1 wherein an adhesive selected from the group consisting of a photocurable adhesive, a pressure-sensitive adhesive, a hot-melt adhesive, and mixtures thereof is applied on said another substrate before said step (D) is performed.

43. A method as claimed in claim 1 wherein in said step (D) said colored layers and said metal layer are transcribed onto said another substrate by contacting said colored layers and said metal under pressure.

44. A method as claimed in claim 1 further comprising a step of curing said colored layers by heating at 100° to 250° C. for 5 minutes to one hour after said step (D) is performed.

45. A method as claimed in claim 1 further comprising a step of photocuring said colored layers after said step (D) is performed.

* * * * *

UNITED STATES PATENT AND TRADEMARK OFFICE
CERTIFICATE OF CORRECTION

PATENT NO. : 5,314,770
DATED : May 24, 1994
INVENTOR(S) : Yukio Yamasita et al.

It is certified that error appears in the above-indentified patent and that said Letters Patent is hereby corrected as shown below:

In column 27, line 55, after "a metal layer", please insert -- in --.

In column 28, line 53, please change "ethyleleglycol" to -- ethyleneglycol --.

In column 28, line 55, please change "propylneglycol" to -- propyleneglycol --.

In column 29, line 64, please change "ethylglycol" to -- ethyleneglycol --.

In column 30, line 1, after "cyclohexanone" please insert -- , --.

Signed and Sealed this

First Day of November, 1994

BRUCE LEHMAN

Attest:

Attesting Officer

Commissioner of Patents and Trademarks